United States Patent
Yoshida

(10) Patent No.: US 7,670,860 B2
(45) Date of Patent: Mar. 2, 2010

(54) METHOD OF MANUFACTURING SEMICONDUCTOR DEVICE AND SEMICONDUCTOR DEVICE

(75) Inventor: Takeo Yoshida, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 252 days.

(21) Appl. No.: 11/797,046

(22) Filed: Apr. 30, 2007

(65) Prior Publication Data

US 2007/0262406 A1 Nov. 15, 2007

(30) Foreign Application Priority Data

May 10, 2006 (JP) .......................... P2006-131706

(51) Int. Cl.
*H01L 21/311* (2006.01)

(52) U.S. Cl. .............................. 438/29; 438/25; 438/38; 362/311.06; 362/351; 257/E21.036; 257/E21.038

(58) Field of Classification Search ................... 438/25, 438/29, 38; 362/311.06, 351; 257/E21.036, 257/E21.038

See application file for complete search history.

(56) References Cited

U.S. PATENT DOCUMENTS 6,221,687 B1 * 4/2001 Abramovich ................ 438/70

6,614,479 B1 * 9/2003 Fukusho et al. ............. 348/340
6,635,912 B2 * 10/2003 Ohkubo ...................... 257/292

FOREIGN PATENT DOCUMENTS

JP 2002-246578 A 8/2002
JP 2003-7988 A 1/2003

* cited by examiner

*Primary Examiner*—David Vu
*Assistant Examiner*—Earl N Taylor
(74) *Attorney, Agent, or Firm*—Birch, Stewart, Kolasch & Birch, LLP

(57) ABSTRACT

A method of manufacturing a semiconductor device, the semiconductor device comprising: a semiconductor substrate; a pixel portion including an in-layer lens; and a peripheral circuit portion including a metal wiring portion, the pixel portion and the peripheral circuit portion being on the semiconductor substrate, the method comprising: forming an insulating film in the pixel portion and the peripheral circuit portion, so as to cover the metal wiring portion; providing, on the insulating film, a lens material layer for forming the in-layer lens; forming a resist layer for etching the lens material layer; curing the resist layer; and forming a first region and a second region in the resist layer, wherein a portion of the resist layer in the first region is thicker than that of the resist layer in the second region, the first region being in the peripheral circuit portion and the second region being in the pixel portion.

7 Claims, 4 Drawing Sheets

METHOD OF MANUFACTURING SEMICONDUCTOR DEVICE AND SEMICONDUCTOR DEVICE

BACKGROUND OF THE INVENTION

1. Field of the Invention

The present invention relates to a method of manufacturing a semiconductor device, and more specifically, to a method of manufacturing a semiconductor device including an in-layer lens in a pixel portion.

2. Description of the Related Art

As a semiconductor device, for example, there has been known a solid-state image pick-up device such as a CCD described in JP-A-2002-246578 and JP-A-2003-7988, for example. In the solid-state image pick-up device, a pixel portion of a semiconductor substrate includes a photoelectric converting portion such as a photodiode and an electric charge transfer portion for transferring an electric charge generated in the photoelectric converting portion, and a microlens is formed on a surface of the pixel portion. Moreover, some solid-state image pick-up devices have such a structure that a predetermined film (for example, a passivation film) in a layer of the pixel portion is set to be an in-layer lens in which a region on the photoelectric converting portion is formed to take a shape of a lens in order to reliably receive a light collected on the microlens by the photoelectric converting portion and to enhance a light sensitivity.

In the case in which a downward convex in-layer lens is provided on an optical layer of a solid-state image pick-up device such as a CCD, a thickness of the downward convex in-layer lens is controlled by using an etch-back method in order to enhance a degree of flatness of a surface of the downward convex in-layer lens layer or to regulate a distance to a microlens in an uppermost part. At this time, there is a fear that the following drawbacks might be caused.

FIG. 4 is a typical sectional view for explaining a part of a process for manufacturing the solid-state image pick-up device. In FIG. 4, a semiconductor substrate 1 is provided with a peripheral circuit portion 1a having a metal wiring portion 3 formed thereon and a pixel portion 1b having a photoelectric converting portion (not shown) and an electric charge transfer electrode 2 formed thereon, and an in-layer lens layer 5 is formed in the pixel portion 1b. The in-layer lens layer 5 is applied onto a whole surface of the semiconductor substrate including the peripheral circuit portion 1a and the pixel portion 1b and is then subjected to a surface treatment to have a predetermined thickness by an etch-back method. At this time, the in-layer lens layer 5 is wholly thinned by the etch-back method. As a result, there is a fear that an upper part of the metal wiring portion 3 covered with the in-layer lens layer 5 in the peripheral circuit portion 1a might be exposed to damage the metal wiring portion 3.

In consideration of the circumstances, it is an object of the invention to provide a method of manufacturing a semiconductor device and the semiconductor device which can prevent a metal wiring portion of a peripheral circuit portion from being damaged when forming an in-layer lens in a pixel portion.

SUMMARY OF THE INVENTION

The object of the invention can be achieved by the following structure.

(1) A method of manufacturing a semiconductor device, the semiconductor device comprising: a semiconductor substrate; a pixel portion including an in-layer lens; and a peripheral circuit portion including a metal wiring portion, the pixel portion and the peripheral circuit portion being on the semiconductor substrate, the method comprising: forming an insulating film in the pixel portion and the peripheral circuit portion, so as to cover the metal wiring portion; providing, on the insulating film, a lens material layer for forming the in-layer lens; forming a resist layer for etching the lens material layer; curing the resist layer; and forming a first region and a second region in the resist layer, wherein a portion of the resist layer in the first region is thicker than that of the resist layer in the second region, the first region being in the peripheral circuit portion and the second region being in the pixel portion.

(2) The method of manufacturing a semiconductor device according to the (1), further providing an auxiliary resist layer on the first region of the resist layer after curing the resist layer.

(3) The method of manufacturing a semiconductor device according to the (1), further developing the portion of the resist layer in the second region after curing the resist layer, so as to have a thickness which is smaller than a thickness of the portion of the resist layer in the first region.

(4) A semiconductor device comprising: a semiconductor substrate; a pixel portion including an in-layer lens, the pixel portion being on the semiconductor substrate; a peripheral circuit portion including a metal wiring portion, the peripheral circuit portion being on the semiconductor substrate; an insulating film covering the metal wiring portion, the insulating film being formed in the pixel portion and the peripheral circuit portion; and a lens material layer provided on the insulating film and serving to form the in-layer lens, wherein a thickness of a portion of the lens material layer in the peripheral circuit portion is greater than a thickness of a portion of the lens material layer in the pixel portion.

According to the invention, the resist layer covering the lens material layer is formed to cause the region on the peripheral circuit portion to be thicker than the pixel portion side. In the case in which the in-layer lens is formed, the lens material layer on the pixel portion and the peripheral circuit portion is thinned when the lens material layer is etched back. However, the resist layer on the peripheral circuit portion is thicker than that on the pixel portion. Therefore, the thickness of the lens material layer remaining on the peripheral circuit portion is greater than that on the pixel portion side after the etch-back. Therefore, the metal wiring portion formed under the lens material layer can be prevented from being exposed in the peripheral circuit portion. Thus, the metal wiring portion can be prevented from being damaged.

DETAILED DESCRIPTION OF THE INVENTION

Embodiments according to the invention will be described below in detail with reference to the drawings.

FIGS. 1A to 1D and 2A to 2C are sectional views for explaining a procedure according to a first embodiment of a method of manufacturing a semiconductor device in accordance with the invention. In the following embodiment, description will be given by taking a solid-state image pick-up device as an example of a semiconductor device. The semiconductor device is not restricted to the solid-state image pick-up device but can also be applied to a CMOS type image sensor, for example The solid-state image pick-up device according to the embodiment has a semiconductor substrate 10 constituted by silicon on which an impurity region is formed by ion doping, and the semiconductor substrate 10 is provided with a photoelectric converting portion such as a photodiode which is not shown and an electric charge transfer region for transferring an electric charge generated in the photoelectric converting portion.

The semiconductor substrate 10 has a peripheral circuit portion 11 to be a region in which a metal wiring portion is to be formed and a pixel portion 21 in which the photoelectric converting portion is formed every pixel.

A gate insulating film is formed on a surface of the semiconductor substrate, which is not shown. For example, the gate insulating film can have a three-layer structure in which an oxide film, a nitride film and an oxide film are sequentially formed.

Figure 1A:
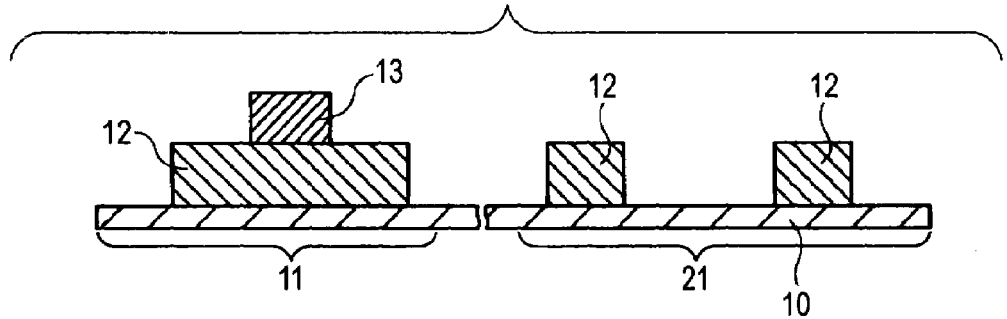
FIGS. 1A to 1D are sectional views for explaining a procedure according to a first embodiment of a method of manufacturing a semiconductor device in accordance with the invention.

As shown in FIG. 1A, an electric charge transfer electrode 12 constituted by polysilicon is formed in the peripheral circuit portion 11 and the pixel portion 21 of the semiconductor substrate 10. Moreover, a metal wiring portion 13 formed of aluminum is provided on the electric charge transfer electrode 12 in the peripheral circuit portion 11 through an insulating film which is not shown.

Figure 1B:
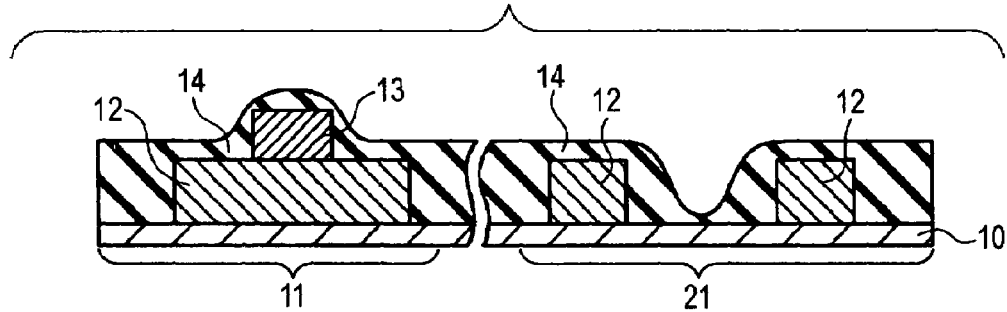

As shown in FIG. 1B, a transparent insulating film 14 such as a BPSG film is formed on the peripheral circuit portion 11 and the pixel portion 21 and a heat treatment (a reflow treatment) is carried out to smoothen a surface of the insulating film 14.

Figure 1C:
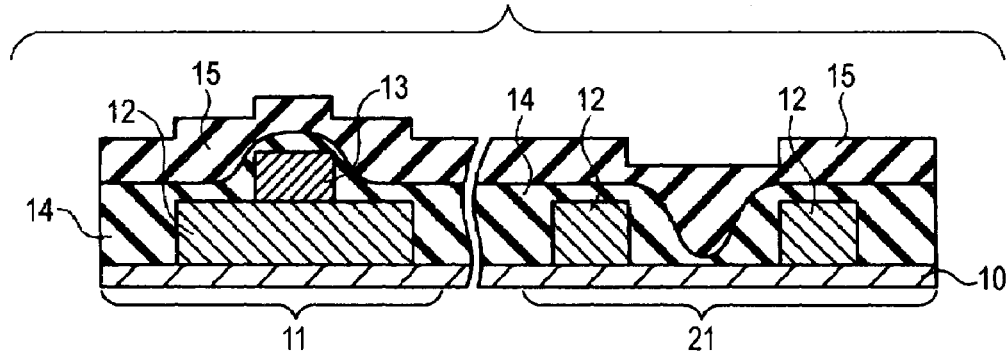

As shown in FIG. 1C, the insulating film 14 is subjected to the reflow treatment and a lens material layer 15 for forming an in-layer lens is then provided on the insulating film 14. In the embodiment, there is employed a structure in which a lens portion taking a downward convex shape of the in-layer lens is positioned on the photoelectric converting portion of the pixel portion 21.

Figure 1D:
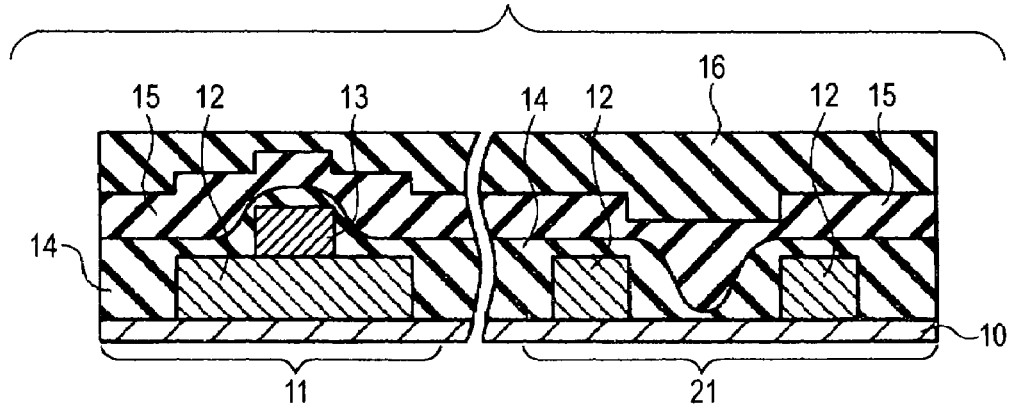

As shown in FIG. 1D, the lens material layer 15 is provided and a positive resist layer 16 for etch-back is then applied onto the lens material layer 15. Thereafter, the resist layer 16 is subjected to a prebaking treatment.

The prebaking treatment is a step of curing the resist layer 16. More specifically, a prebaking treatment at a high temperature of 180° C. to 230° C. is carried out differently from the related-art treatment at approximately 90° C. to 110° C., and the resist layer 16 is thus cured. Moreover, means for curing the resist layer 16 is not restricted to the prebaking treatment but an ultraviolet radiating apparatus may be used to cure a thermal effect component included in the resist layer 16 by an ultraviolet energy.

Figure 2A:
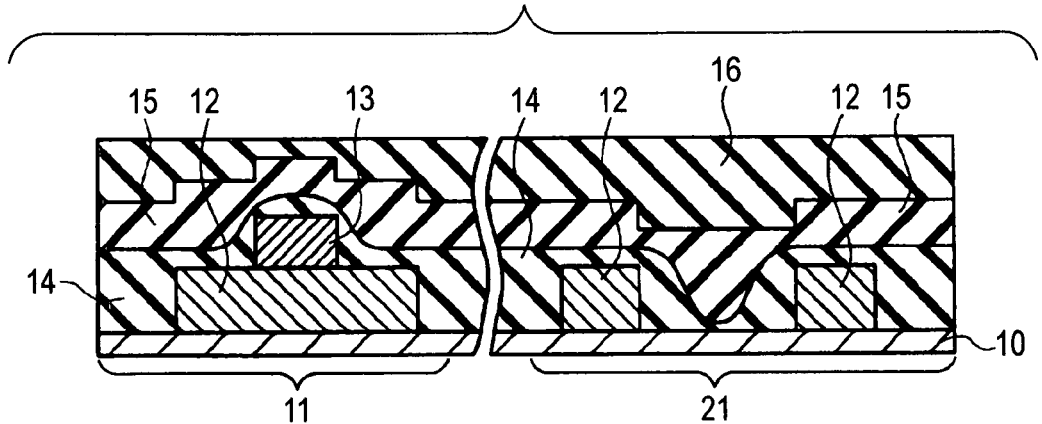
FIGS. 2A to 2C are sectional views for explaining the procedure according to the first embodiment of the method of manufacturing a semiconductor device.
Figure 2B:
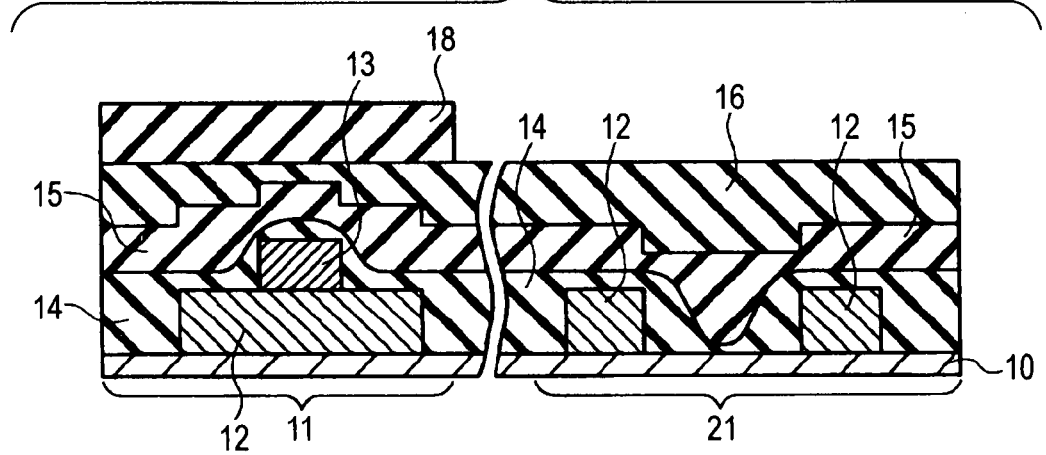

As shown in FIGS. 2A and 2B, next, an auxiliary resist layer 18 is provided in a region on the peripheral circuit portion 11 in the cured resist layer 16 in the embodiment. When the auxiliary resist layer 18 is to be formed, an exposure and a development are carried out by a mask patterned at a photolithographic step so as not to form the auxiliary resist layer 18 in a region of the pixel portion 21. At this time, an exposing apparatus is not particularly restricted if it is adapted to a photosensitive mechanism of the auxiliary resist layer 18.

Figure 2C:
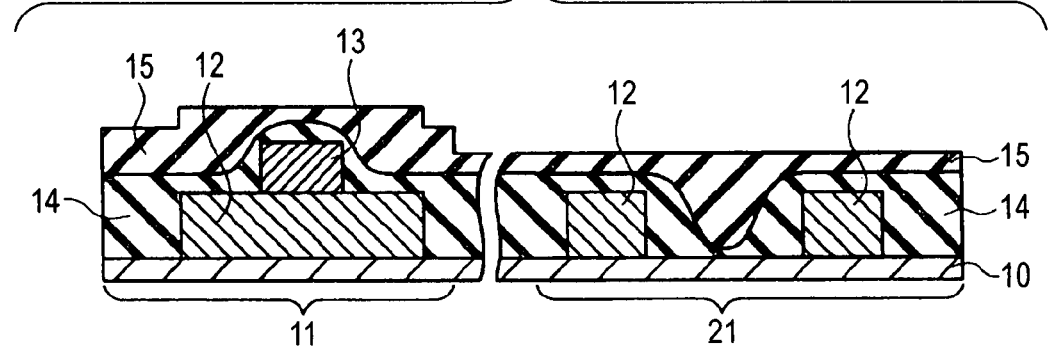

As shown in FIG. 2C, an etch-back treatment is carried out in a state in which the resist layer 16 and the auxiliary resist layer 18 are formed. Consequently, the lens material layer 15 covering the peripheral circuit portion 11 and the pixel portion 12 is uniformly thinned by the etch-back. However, the auxiliary resist layer 18 is further formed on the resist layer 16 in the peripheral circuit portion 11. In the peripheral circuit portion 11, therefore, the lens material layer 15 can be left more thickly than the lens material layer 15 provided on the pixel portion 21. At this time, it is possible to prevent the metal wiring portion 13 from being exposed from the lens material layer 15.

Moreover, the solid-state image pick-up device obtained by the manufacturing method according to the embodiment can be formed in such a manner that the lens material layer 15 has a thickness which is greater on the peripheral circuit portion 11 than on the pixel portion 21 side.

According to the manufacturing method in accordance with the embodiment, the resist layer 16 covering the lens material layer 15 is formed more thickly in the region on the peripheral circuit portion 11 than on the pixel portion 21 side. In the case in which an in-layer lens is formed, the lens material layer 15 on the pixel portion 21 and the peripheral circuit portion 11 is thinned when the lens material layer 15 is etched back. The resist layer 16 provided on the peripheral circuit portion 11 is thicker than the pixel portion 21 by the auxiliary resist layer 18. For this reason, the thickness of the lens material layer 15 remaining on the peripheral circuit portion 11 after the etch-back is greater than that on the pixel portion 21 side. Therefore, the metal wiring portion 13 formed under the lens material layer 15 in the peripheral circuit portion 11 can be prevented from being exposed. Thus, it is possible to prevent the metal wiring portion 13 from being damaged.

While the step of further providing the auxiliary resist layer 18 in the region on the peripheral circuit portion 11 in the resist layer 16 has been carried out in the embodiment, other means may be used as will be described in the following embodiment if the thickness of the resist layer on the peripheral circuit portion 11 of the resist layer can be substantially made greater than that of the pixel portion 21.

Next, description will be given to a second embodiment according to the invention. In the embodiment which will be described below, members having the same structures and functions as the members described above have the same designations or corresponding designations in the drawings, and description will be thus simplified or omitted.

Figure 3A:
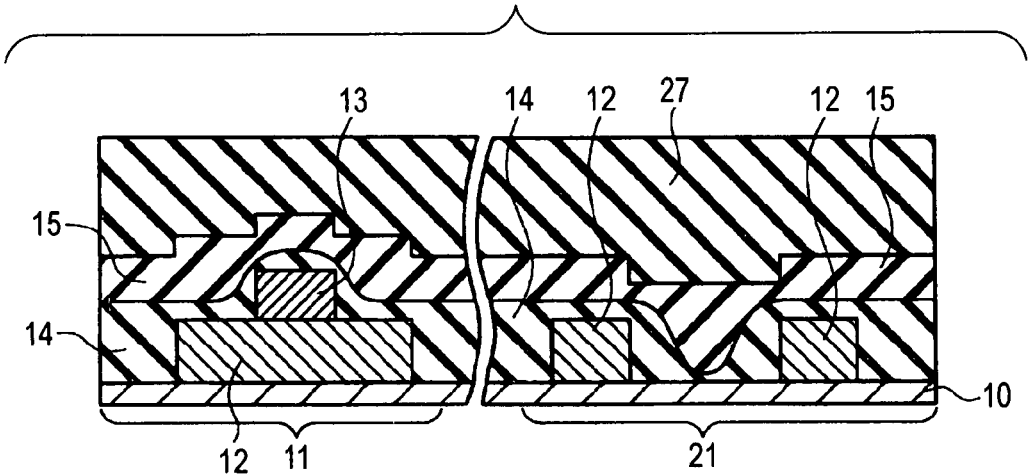
FIGS. 3A to 3C are sectional views for explaining a procedure according to a second embodiment of the method of manufacturing a semiconductor device.
Figure 3B:
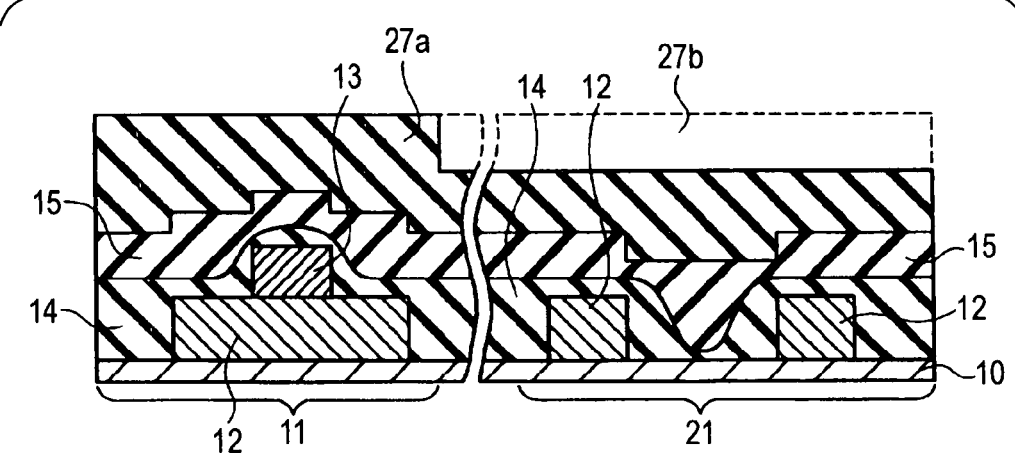
Figure 3C:
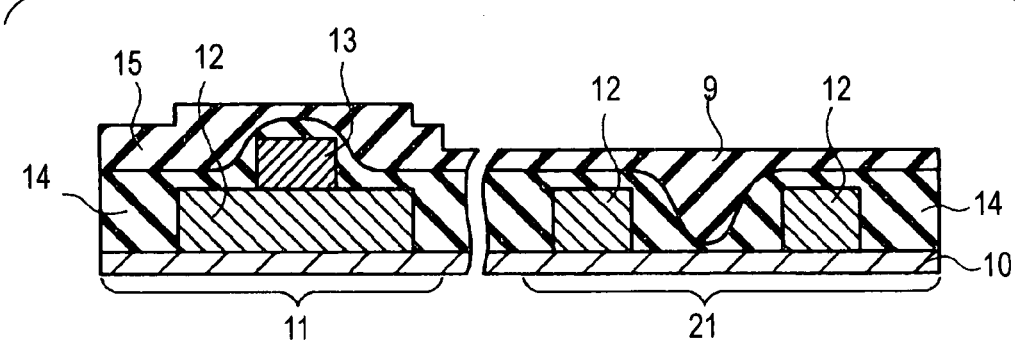
Figure 4:
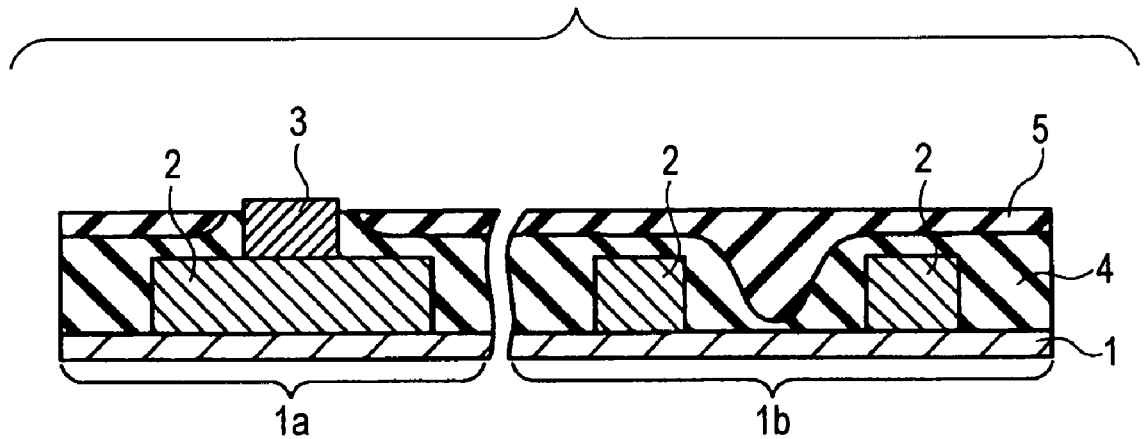
FIG. 4 is a typical sectional view for explaining a part of a process for manufacturing a solid-state image pick-up device.

FIGS. 3A to 3C are sectional views for explaining a procedure according to the second embodiment of the method of manufacturing a semiconductor device in accordance with the invention. In the embodiment, since a procedure for forming an insulating film 14 and a lens material layer 15 on a peripheral circuit portion 11 and a pixel portion 21 in a semiconductor substrate 10 is the same as that in the embodiment, description will be omitted.

As shown in FIG. 3A, a positive resist layer 27 for etching back the lens material layer 15 is formed in a thickness of 800 nm to 2400 nm on the lens material layer 15. In the related art, a thickness of the resist layer applied is 400 nm to 1200 nm. A photoresist is a material corresponding to an i ray exposure or a g ray exposure.

Next, the resist layer 27 is subjected to a prebaking treatment and is thus cured. The prebaking treatment can be carried out in the same manner as in the embodiment described above. More specifically, the prebaking treatment is carried out at a high temperature of 180° C. to 230° C. differently from the prebaking treatment at approximately 90° C. to 110° C. in the related art. Thus, the resist layer 27 is cured.

In the embodiment, as shown in FIG. 3B, by using a photomask setting, as an exposing region, a region 27b on the pixel portion 21 in the resist layer 27, only the region 27b on the pixel portion 21 is exposed and PEB (a baking treatment after the exposure) and a developing treatment are carried out. A exposing light source is the i ray or the g ray, and an exposing energy is set to be lower than Eth (an exposing energy at which a photoresist remaining film to be dissolved in a developer is exactly zero). By setting the exposing energy to be less than Eth, thus, it is possible to regulate a thickness of the residual film of the resist layer 27 after the development. In general, a developing speed of Eth or less, particularly, a developing speed immediately after a start of the development is high and is hard to control. By controlling a prebaking temperature to be higher than usual and controlling a PEB temperature to be lower than usual, however, it is possible to remarkably reduce a developer dissolving speed, thereby enhancing a controllability. Since a pattern of a region to be exposed does not need to be strict but may be rough, it is not an impediment. For the developer, moreover, a TMAH solution having an optional concentration is used and a time required for the development is set to be 30 to 90 seconds.

In the resist layer 27 subjected to the developing treatment, thus, a region 27a on the peripheral circuit portion 11 is left more thickly than the region 27b on the pixel portion 21. Therefore, a sufficient thickness for a protection from the etch-back can be maintained, and at the same time, the pixel portion 21 can have a desirable resist thickness which is necessary for an etch-back material. As shown in FIG. 3C, therefore, a metal wiring portion 13 in the peripheral circuit portion 11 can be prevented from being exposed from the lens material layer 15.

According to the method of manufacturing a semiconductor device in accordance with the invention, it is possible to etch back the pixel portion without influencing the peripheral circuit portion irrespective of a difference in the step which is caused by a design of the pixel portion and the peripheral circuit portion.

The invention is not restricted to the embodiments but proper changes and improvements can be made.

For example, the invention is not restricted to the process for forming the downward convex type in-layer lens described in the embodiments but can be applied to a semiconductor device having a structure requiring the protection of the peripheral circuit portion by using an etch-back process.

According to the invention, it is possible to provide a method of manufacturing a semiconductor device and the semiconductor device which can prevent a metal wiring portion of a peripheral circuit portion from being damaged when forming an in-layer lens in a pixel portion.

The entire disclosure of each and every foreign patent application from which the benefit of foreign priority has been claimed in the present application is incorporated herein by reference, as if fully set forth.

What is claimed is:

1. A method of manufacturing a semiconductor device, the semiconductor device comprising: a semiconductor substrate; a pixel portion including an in-layer lens; and a peripheral circuit portion including a metal wiring portion, the pixel portion and the peripheral circuit portion being on the semiconductor substrate, the method comprising:
forming an insulating film in the pixel portion and the peripheral circuit portion, so as to cover the metal wiring portion;
providing, on the insulating film, a lens material layer for forming the in-layer lens;
forming a resist layer for etching the lens material layer;
curing the resist layer; and
forming a first region and a second region in the resist layer, wherein a portion of the resist layer in the first region is thicker than that of the resist layer in the second region, the first region being in the peripheral circuit portion and the second region being in the pixel portion.

2. The method of manufacturing a semiconductor device according to claim 1, further developing the portion of the resist layer in the second region after curing the resist layer, so as to have a thickness which is smaller than a thickness of the portion of the resist layer in the first region.

3. The method of manufacturing a semiconductor device according to claim 2, wherein the resist layer has a thickness of 800 nm to 2400 nm.

4. The method of manufacturing a semiconductor device according to claim 1, further comprising etching back the lens material layer so as to form the in-layer lens.

5. The method of manufacturing a semiconductor device according to claim 1, wherein the curing the resist layer is performed by a prebaking treatment at a temperature of 180° C. to 230° C.

6. A method of manufacturing a semiconductor device, the semiconductor device comprising: a semiconductor substrate: a pixel portion including an in-layer lens; and a peripheral circuit portion including a metal wiring portion. the pixel portion and the peripheral portion being on the semiconductor substrate, the method comprising:
forming an insulating film in the pixel portion and the peripheral circuit portion, so as to cover the metal wiring portion;
providing, on the insulating film a lens material layer for forming the in-layer lens;
forming a resist layer for etching the lens material layer;
curing the resist layer; and
forming a first region and a second region in the resist layer, wherein a portion of the resist layer in the first region is thicker than that of the resist layer in the second region, the first region being in the pixel portion and the second region being in the peripheral circuit portion.

7. The method of manufacturing a semiconductor device according to claim 6, further providing an auxiliary resist layer on the second region of the resist layer after curing the resist layer to provide a greater total resist layer thickness over the second region as compared to the total resist layer thickness over the first.

* * * * *